United States Patent
Kochar et al.

(10) Patent No.: US 9,312,026 B2
(45) Date of Patent: Apr. 12, 2016

(54) ZONED ERASE VERIFY IN THREE DIMENSIONAL NONVOLATILE MEMORY

(71) Applicant: SanDisk Technologies Inc., Plano, TX (US)

(72) Inventors: Mrinal Kochar, San Jose, CA (US); Gautam Dusija, Milpitas, CA (US); Chris Avila, Saratoga, CA (US); Yingda Dong, San Jose, CA (US); Man Mui, Fremont, CA (US); Yichao Huang, San Jose, CA (US); Deepak Raghu, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/466,786

(22) Filed: Aug. 22, 2014

(65) Prior Publication Data
US 2016/0055918 A1    Feb. 25, 2016

(51) Int. Cl.
*G11C 16/16* (2006.01)
*G11C 16/34* (2006.01)

(52) U.S. Cl.
CPC ............ *G11C 16/3445* (2013.01); *G11C 16/16* (2013.01)

(58) Field of Classification Search
CPC ........................................................ G11C 16/16
USPC ....................................................... 365/185.33
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 2005/0219909 A1* | 10/2005 | Futatsuyama | G11C 16/16 365/185.22 |
| 2012/0220088 A1 | 8/2012 | Alsmeier | |
| 2014/0133232 A1 | 5/2014 | Avila et al. | |
| 2014/0153333 A1 | 6/2014 | Avila | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 13/871,528, filed Apr. 26, 2013, entitled "Defective Block Management," 30 pages.
U.S. Appl. No. 14/016,785, filed Sep. 3, 2013, entitled "Bad Block Reconfiguration in Nonvolatile Memory," 44 pages.

* cited by examiner

*Primary Examiner* — Son Mai
(74) *Attorney, Agent, or Firm* — Davis Wright Tremaine LLP

(57) ABSTRACT

In a three-dimensional nonvolatile memory, when a block erase failure occurs, zones within a block may be separately verified to see if some zones pass verification. Zones that pass may be designated as good zones and may subsequently be used to store user data while bad zones in the same block may be designated as bad and may not be used for subsequent storage of user data.

22 Claims, 16 Drawing Sheets

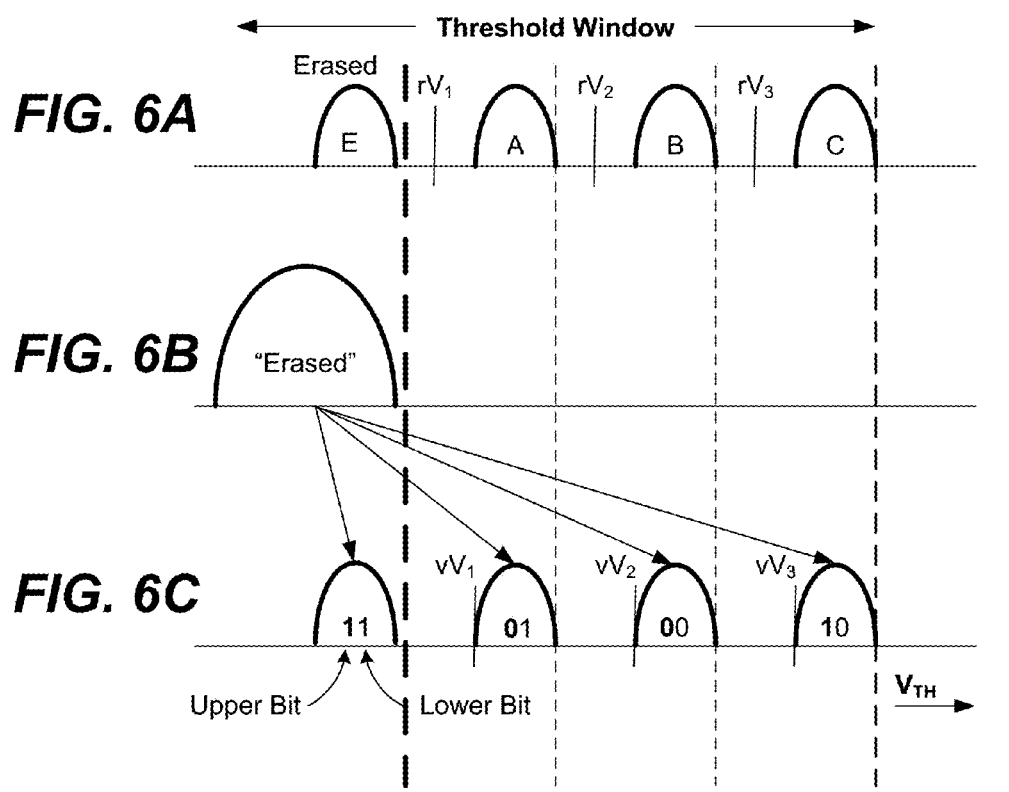

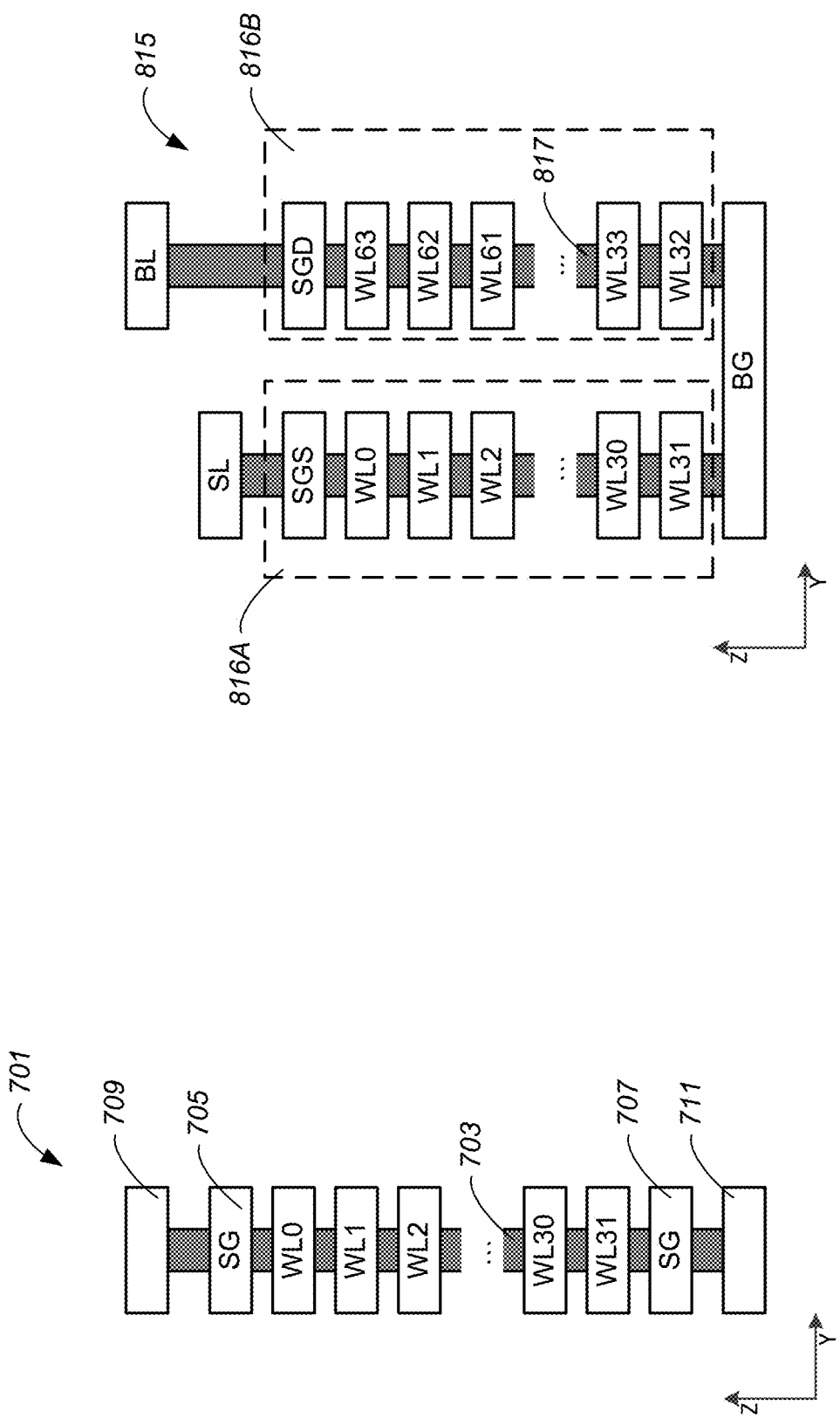

| BLOCK | STATUS |
|---|---|
| Block 0 | |
| Block 1 | Bad |
| Block 2 | |
| Block 3 | Partial |
| ... | ... |
| Block N-1 | |
| Block N | |

| ZONE | STATUS |
|---|---|
| Zone 0 | |
| Zone 1 | Bad |
| Zone 2 | Bad |
| Zone 3 | |
| ... | ... |
| Zone X-1 | |
| Zone X | |

ZONED ERASE VERIFY IN THREE DIMENSIONAL NONVOLATILE MEMORY

BACKGROUND

This application relates to the operation of re-programmable nonvolatile three dimensional memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are monolithically formed in one or more physical levels of memory cells having active areas disposed above a substrate.

SUMMARY OF THE INVENTION

In some three-dimensional block-erasable nonvolatile memory systems, a block may fail to erase either during initial testing (prior to storage of user data) or later (after it has been used to store user data). Such blocks may be designated as bad blocks and subsequent storage of data in such bad blocks may be prohibited. A sub-block verification scheme may be applied to such a block so that one or more sub-block or zone may be identified as failing to erase while other sub-blocks or zones may be identified as erasing successfully. Subsequently, the good sub-blocks may store user data while the bad sub-block may be designated as bad and subsequent storage in such bad sub-blocks may be prohibited. Thus, rather than discarding the entire block when it fails to erase, partial block verification may allow a substantial portion of the block to remain in use thereby increasing the available memory capacity. The locations of such bad sub-blocks may be recorded. Bad sub-blocks may be configured by raising threshold voltages of memory cells in the bad sub-blocks above an erased level so that the effects of bad sub-blocks on data stored in good sub-blocks is maintained at acceptable levels.

An example of a method of operating blocks of memory cells in a block-erasable NAND flash memory includes: performing a block erase operation that applies an erase voltage to all word lines of the block; subsequently performing a block erase verify operation to determine if the block erase operation was successful; in response to determining that the block erase operation was not successful performing a sub-block erase verify operation that applies an erase verify voltage to a first subset of word lines of the block and does not apply the erase verify voltage to a second subset of word lines of the block to determine if the block erase operation successfully erased the first subset of word lines; and if the sub-block erase verify operation indicates that the first subset of word lines is erased then designating the first subset of word lines as a good subset for subsequent storage of data.

The sub-block erase verify operation may apply additional erase verify voltages to the first subset of word lines of the block to obtain a distribution of threshold voltages of the sub-block. The first subset of word lines of the block may consist of one word line and the erase verify voltage may be a read voltage, and all other word lines of the block may receive a read pass voltage. One or more additional sub-block erase verify operations may be performed to identify other subsets of word lines of the block for designation as good subsets for subsequent storage of data. If the sub-block erase verify operation or an additional sub-block erase verify operation indicates that a corresponding subset of word lines is not erased then the corresponding subset of word lines may be designated as a bad subset that is not good for subsequent storage of data. The one or more additional sub-block erase verify operations may be performed for subsets that include all word lines of the block so that the entire block is mapped into subsets and each subset is either designated as being a good subset for subsequent storage of data or as a bad subset that is not for subsequent storage of data. Each subset may be an individual word line that is subject to a separate sub-block erase verify and is individually designated as a good word line for subsequent storage of data or as a bad word line that is not for subsequent storage of data. Each subset may be a plurality of word lines that is subject to a separate sub-block erase verify and is individually designated as a good plurality of word lines for subsequent storage of data or as a bad plurality of word lines for subsequent storage of data. Word lines of a block may be divided into subsets in zones based on physical location, zones consisting of equal numbers of neighboring word lines. The block-erasable NAND flash memory may be a monolithic three-dimensional semiconductor memory device comprising a plurality of memory device levels vertically disposed above a silicon substrate and word lines of the block may be divided into zones based on respective vertical levels with respect to the underlying substrate. Driver circuits for accessing the block-erasable NAND flash memory may also be disposed on the silicon substrate.

An example of a method of operating a block of memory cells in a monolithic three-dimensional block-erasable memory device that has a plurality of device levels vertically disposed above a silicon substrate includes: performing a block erase operation that applies an erase voltage to word lines in all of the plurality of memory device levels of the block; subsequently performing a block erase verify operation to determine if the block erase operation was successful; in response to determining that the block erase operation was not successful performing a series of sub-block erase testing operations that apply an erase verify voltage to word lines of a selected sub-block of the block while not applying the erase verify voltage to word lines of unselected sub-blocks of the block to verify if word lines of the selected sub-block are erased; subsequently mapping each of the sub-blocks as either a good sub-block or a bad sub-block according to the results of the sub-block testing operations; and subsequently storing user data in good sub-blocks while prohibiting storage of user data in bad sub-blocks.

The block may include a plurality of sets of strings, each set of strings including vertical NAND strings that share word lines, and individual erase testing may be performed on a first set of strings by applying an erase voltage to word lines of the first set of strings while not applying the erase verify voltage to word lines of unselected sets of strings. Erase testing may be individually performed on each set of strings of the block and any set of strings that fails erase testing may be designated as a bad set of strings that is not good for subsequent storage of data. The bad sub-blocks may be configured by raising threshold voltages of memory cells of the bad-sub blocks above an erased level. The configuring of the bad sub-blocks may be repeated at intervals based on write-erase cycle count of the block. Different voltages may be applied to word lines of good sub-blocks and bad sub-blocks during subsequent memory access operations. Applying different voltages may include applying an erase voltage to word lines of good sub-blocks during subsequent erase operations while applying a voltage that is lower than the erase voltage to word lines of bad sub-blocks. Applying different voltages may include at least one of: applying a different read pass voltage, or applying a different write pass voltage, or applying a different boosting voltage.

An example of a monolithic block-erasable three-dimensional semiconductor memory device formed in multiple physical levels of memory elements disposed above a silicon substrate includes: a first plurality of blocks that pass block erase testing and are designated for block erase in which an erase voltage is applied to word lines of all physical levels of the block at the same time; and a second plurality of blocks that fail block erase testing and subsequently pass sub-block erase testing and are configured for sub-block operation in which at least one sub-block that includes a plurality of word lines is designated as a bad sub-block and is not used to store user data while at least one other sub-block that includes a plurality of word lines is designated as a good sub-block and is used to store user data.

The word lines of a block of the second plurality of blocks may be divided into sub-blocks according to their physical level with respect to the silicon substrate. Driver circuitry associated with one or more of the memory elements may be disposed on the silicon substrate.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

DETAILED DESCRIPTION

Memory System

Figure 1:
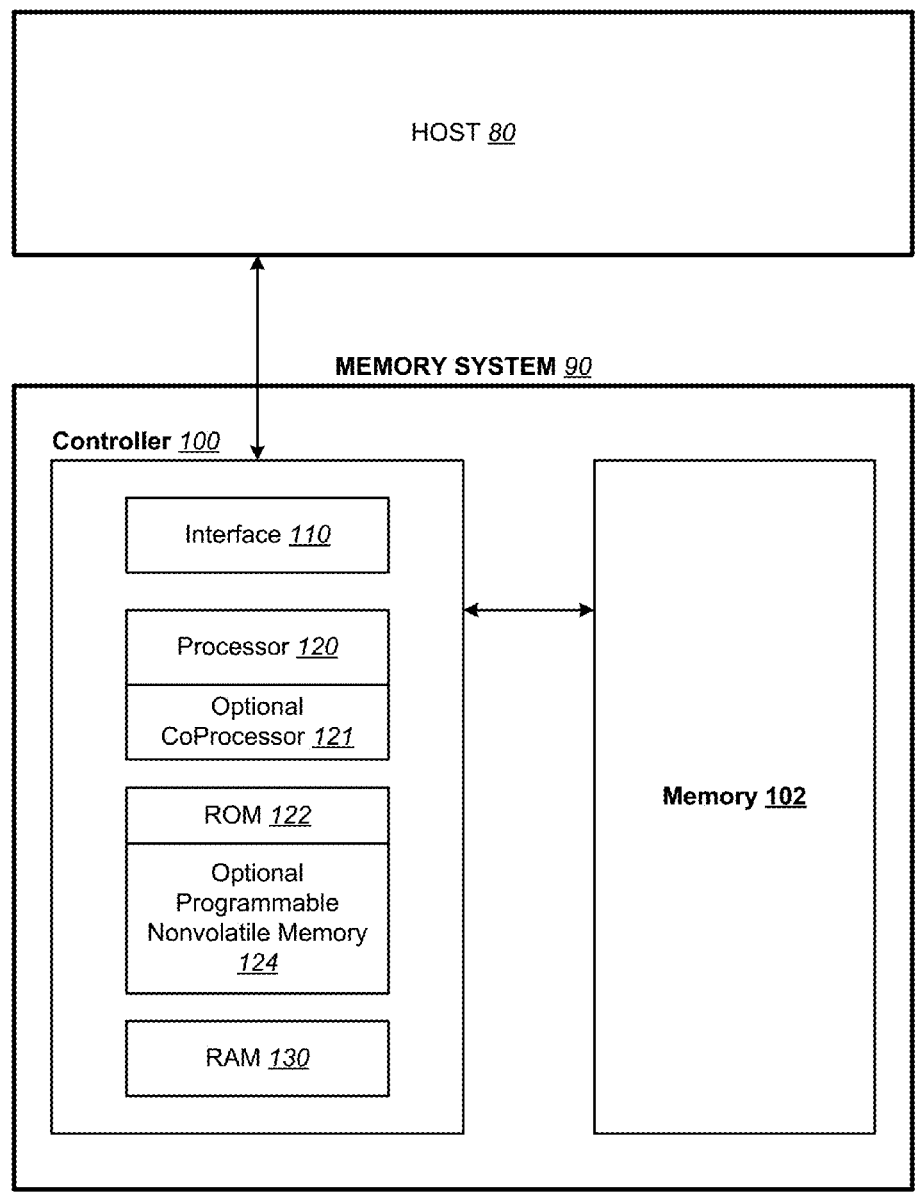
FIG. 1 illustrates schematically the main hardware components of a memory system suitable for implementing the present invention.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
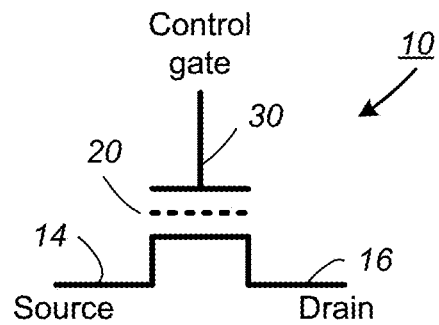
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
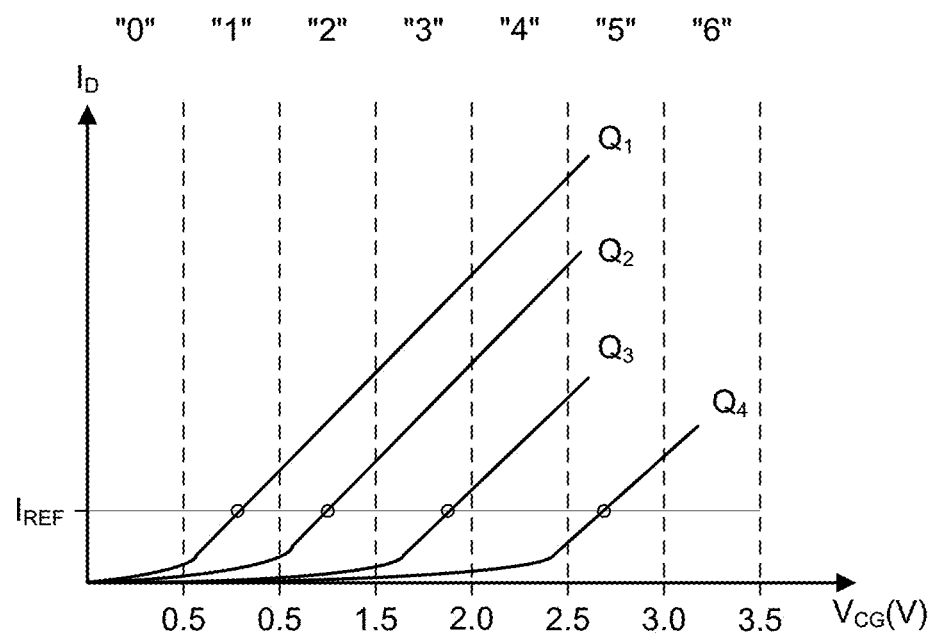
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG 0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from -1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
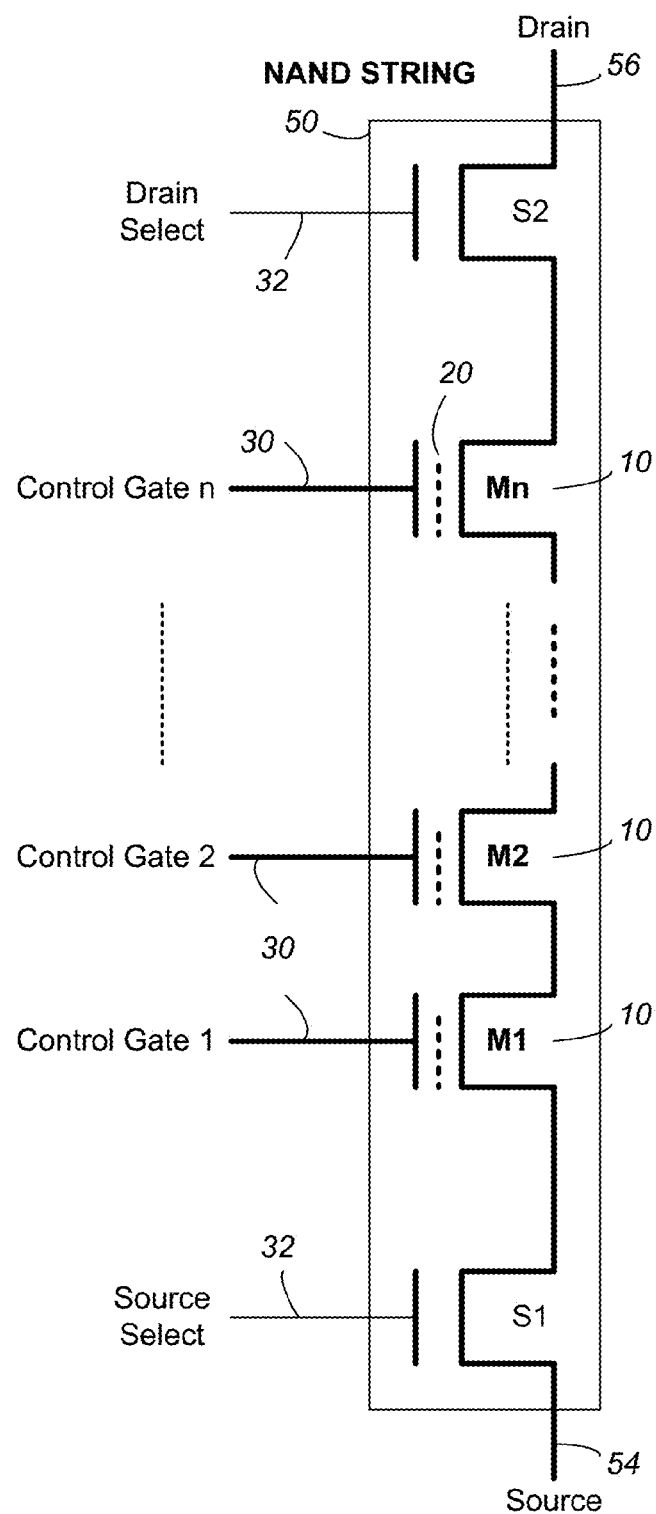
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
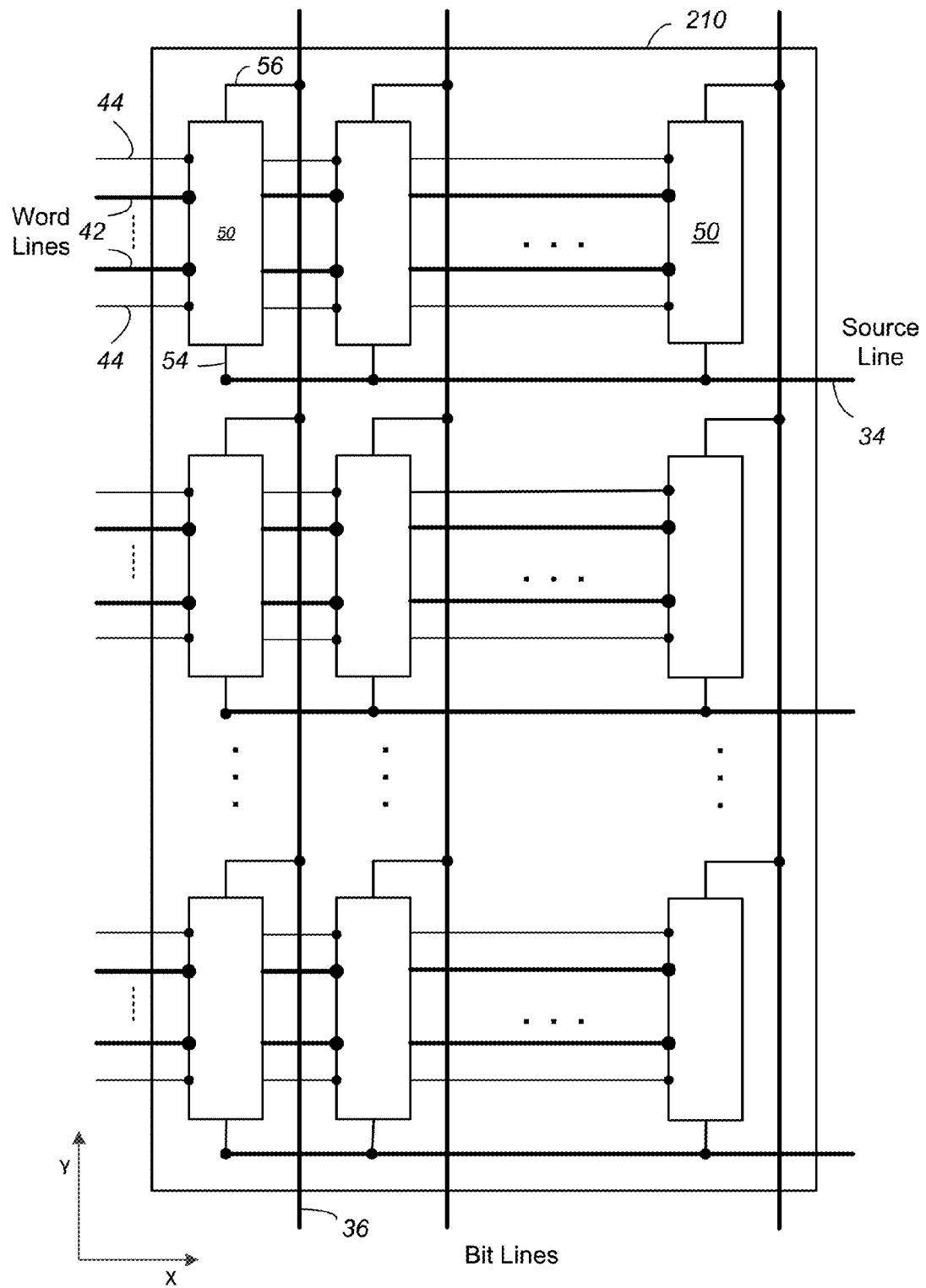
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
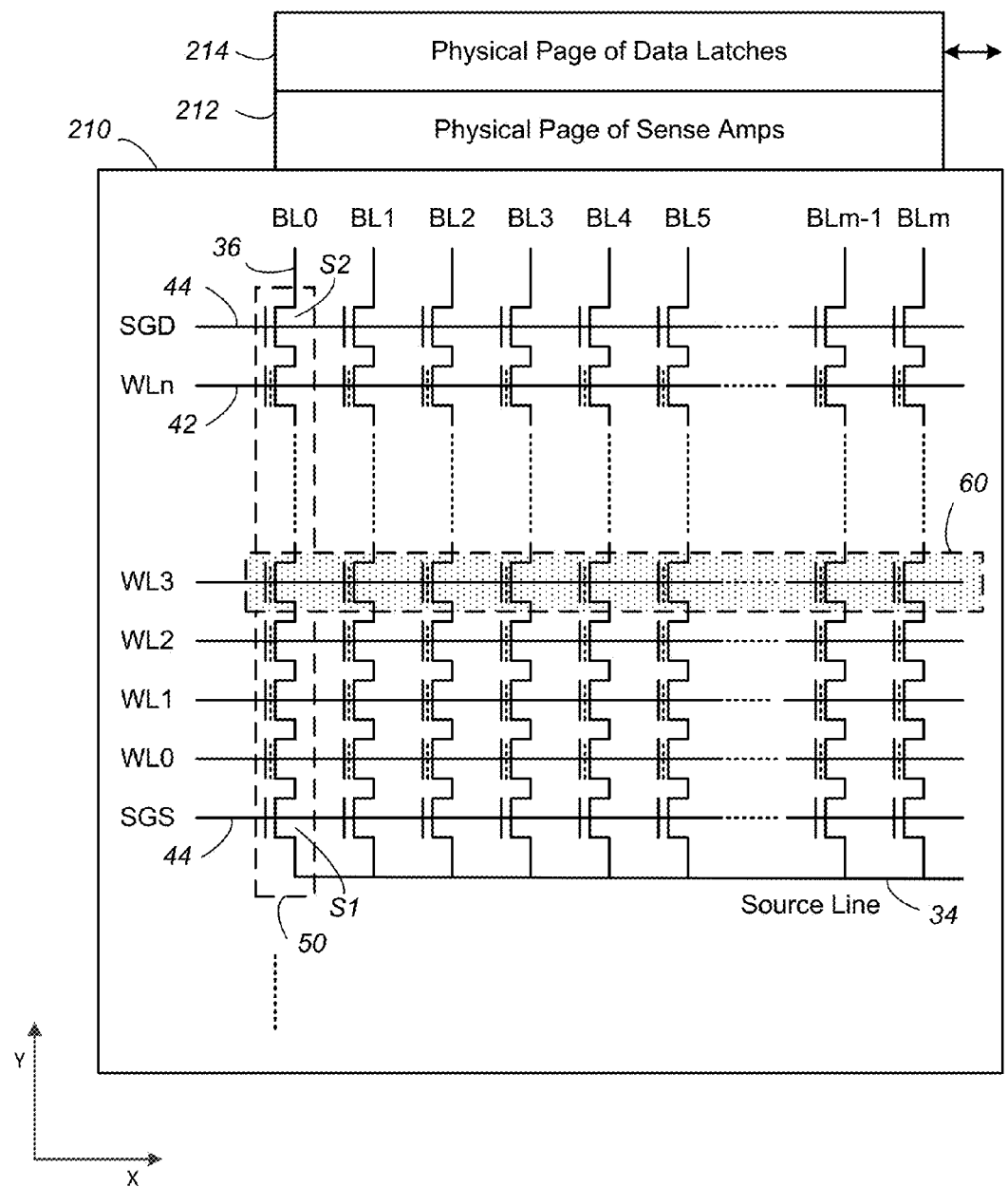
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
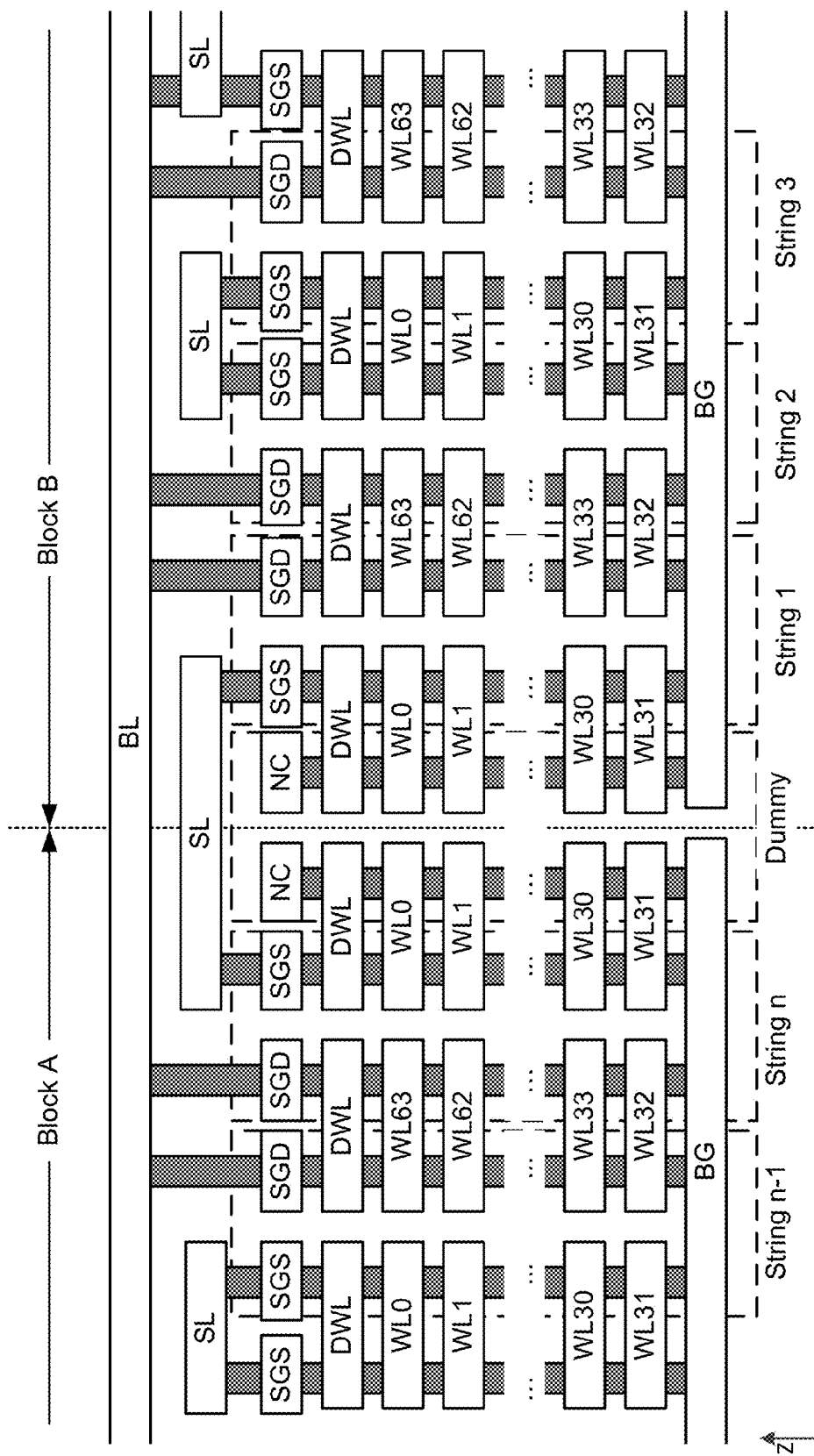
FIG. 9 shows a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9 shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9 shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
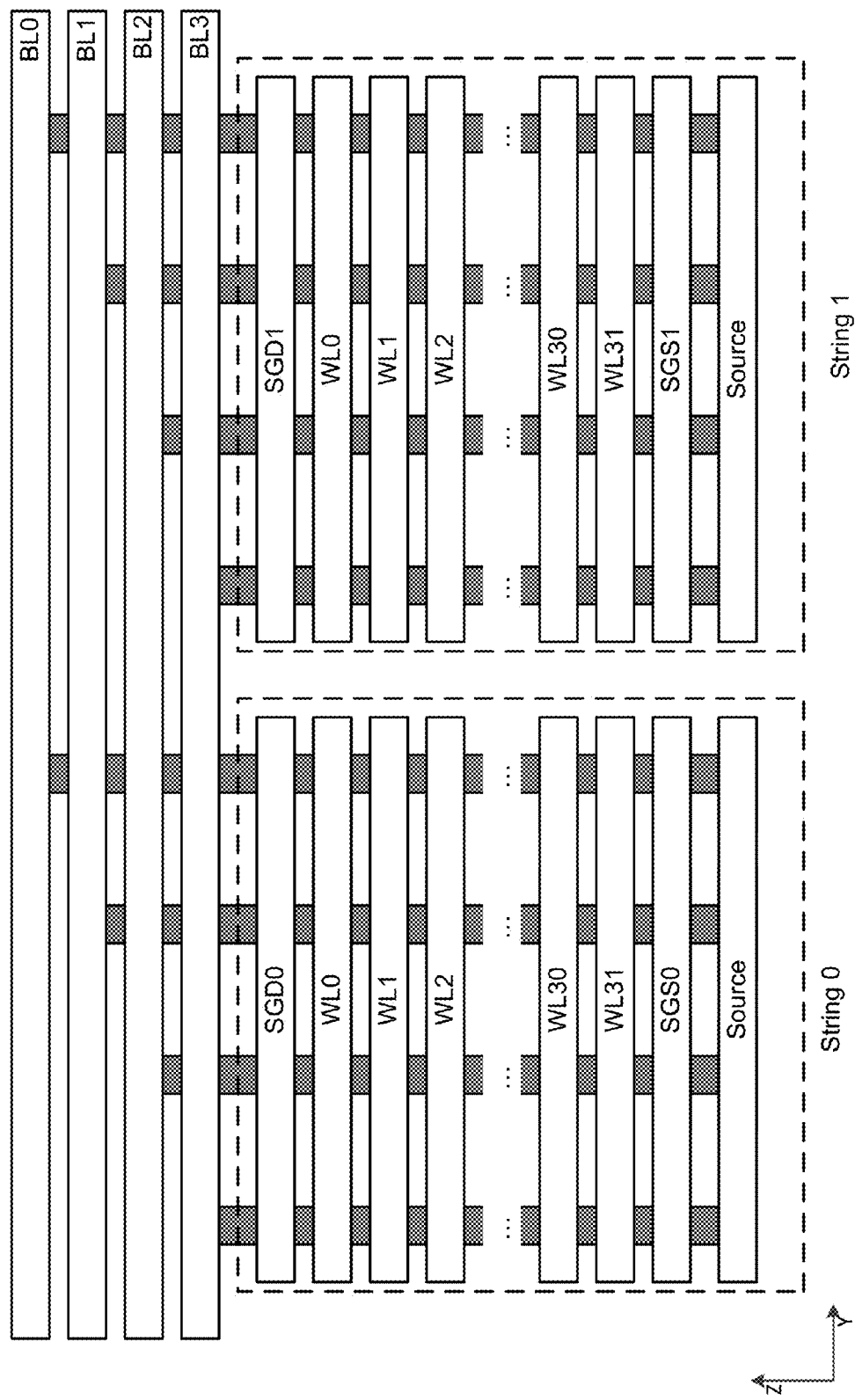
FIG. 10 shows a cross section of a 3-D NAND memory with straight NAND strings in the y-z plane.
Figure 11:
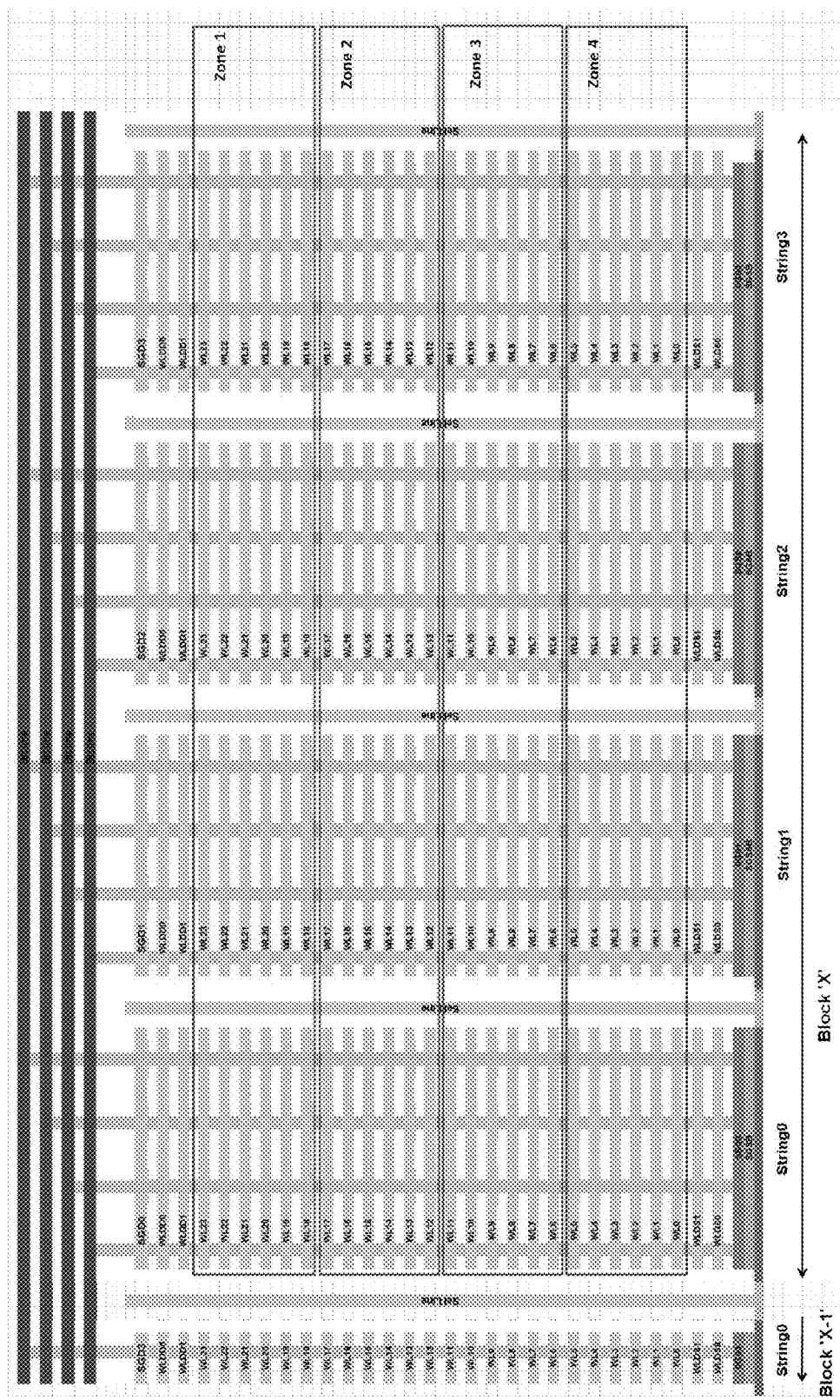
FIG. 11 shows another cross section of a 3-D NAND memory with blocks divided into sub-blocks, or zones.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. FIG. 11 shows separation between word lines of different strings, e.g. WL0 in string 1 and WL0 in string 2. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10).

In general, charge-storage memories such as NAND flash memories are erased on a block basis. When a block is erased, erase conditions are applied to all memory cells of the block in an erase step to remove charge from all memory cells of the block in order to bring threshold voltages below a predetermined voltage that corresponds to an erased condition. An erase verify step then verifies if memory cells have been adequately erased. An erase verify step is generally performed on the block as a unit with all word lines receiving the same erase verify voltage and with sense amplifiers determining how much current flows through NAND strings. If memory cells along a string are adequately erased then current in the string will exceed a predetermined amount. If memory cells along a string are not adequately erased then current in the string will not exceed the predetermined amount. Erase and erase verify steps may be repeated until current reaches an acceptable level. Ideally, all memory cells in a block would reach the erased condition and all NAND strings would be conductive. However, it may be acceptable to have a limited number of cells that fail to erase completely because a small number of errors may be correctable by ECC. Once the block is verified as erased then the block may be considered to be erased and may be made available for subsequent programming (e.g. placed in an erased block pool).

In some cases, a block may fail to erase. For example, after some number of erase and erase verify steps, there may still be a significant number of NAND strings that are not conductive. In this case, the block may be considered to have failed to erase. In many cases, such an erase fail condition results in the block being designated as a bad block that is subsequently not used for storage of user data. If a sufficient number of blocks are designated as bad blocks, either due to an erase fail, or for some other reason, then the memory may be considered to have failed.

According to an example presented here, a block that experiences an erase failure is not automatically designated as a bad block. Instead, such a block may be subject to a zone based erase verification step to determine if memory cells in one or more zones have been successfully erased. If memory cells in a particular zone have been successfully erased then the zone may be used for subsequent storage of user data even if one or more other zones have not been successfully erased and cannot be used for storage of user data. Thus, by zoning a block and performing a zone-specific erase verify step for each zone, an erase failure may be limited to one or more zones rather than a whole block, and only the affected zone may be discarded (i.e. marked as bad and not used for storage of user data). When a block contains at least one zone that fails a zone verify then it may be used to store an amount of data that is less than the normal capacity of a good block. Such a block may be designated as a "Partial block" and its status may be recorded along with information regarding the zone or zones that failed to erase.

FIG. 11 shows a larger scale illustration of a block, Block X, which includes multiple sets of straight NAND strings. In this case, Block X includes four such sets of strings (String 0-String 3). Memory cells are arranged in multiple physical levels that are disposed above a silicon substrate. Twenty four physical levels corresponding to WL0-WL23 contain memory cells that are used to store user data. In addition, dummy word lines are provided at both the source side (WLDS0 and WLDS1) and the drain side (WLDD0 and WLDD1). The active memory cells (memory cells used to store user data) are zoned according to height (position with respect to the substrate) in this example. In this example, the block is zoned into four zones each of which contains six physical levels of memory cells. In other examples, a different number of zones containing different numbers of levels of memory cells may be used.

According to an example of zoned erase verify, zones 1-3 may be separately verified as erased if block X fails a block-level erase verify. In general, it is desirable to maintain a block as the unit of erase and erase verify so that erase operations are efficiently performed. However, if a block, such as block X, fails to erase when subject to a block erase then another approach may be used. For example, a zone-by-zone verification may indicate that one or more zones are adequately erased (i.e. threshold voltages of substantially all memory cells in the zone are in a range corresponding to an erased condition) while other zones are not adequately erased. Failure of a block erase verify may be caused by failure to erase a group of memory cells which may be clustered in a particular zone. When a zone-by-zone verify scheme is used, the zone containing the cluster may fail and be considered a bad zone, while other zones that do not contain such memory cells may pass and be considered as good zones. The zones that pass may subsequently be used to store user data thus maintaining data storage capacity that would be lost if only a block level verify was used.

Figures 12, 13, 14:
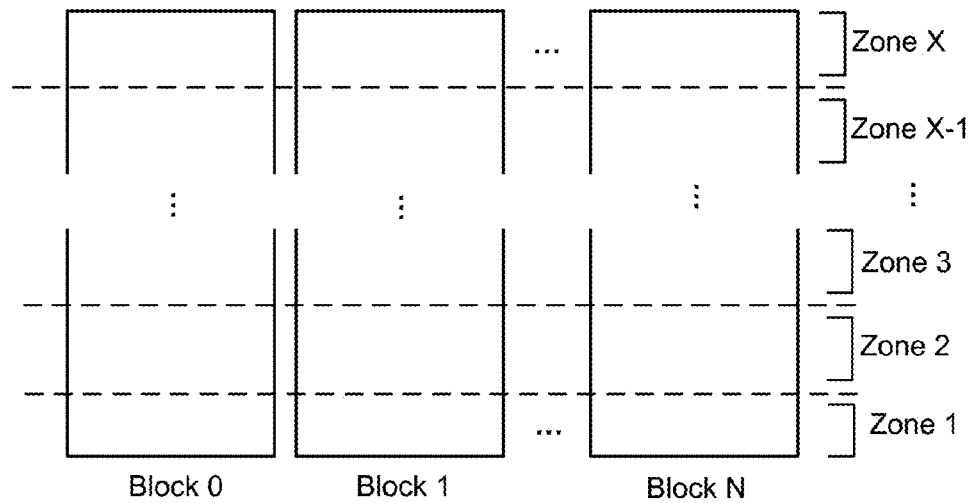
FIG. 12 illustrates zoning of levels across multiple blocks.
FIG. 13 shows a table that indicates bad blocks and partial blocks.
FIG. 14 shows a table that indicates bad sub-blocks or zones in a partial block.

FIG. 12 shows a portion of a memory that includes blocks 0-N with zones 1-X extending across all blocks. The number of zones, X, may be any suitable number between two and the number of physical levels of memory cells (i.e. zones can contain as few as one physical level). In some memory systems, parameters may be applied on a zone-by-zone basis. For example boosting schemes may apply boosting voltages on a zone basis. The zoning used for erase verify may be the same as used for operating parameters for boosting or some other scheme. Alternatively, different zoning schemes may be used for different purposes (i.e. different zones may be used for operating parameters such as boosting voltages and for zone verify). While FIG. 12 shows uniform zoning across all blocks, in other examples, zones may vary from block to block. For example, blocks in particular locations may have different failure modes and zoning may be adapted according to likely failure modes.

Any suitable method may be used to determine if the memory cells of a particular zone are erased. For example, a verification step may be similar to a read step with a low read voltage. A read pass voltage may be applied to unselected word lines while a read voltage is applied to a selected word line or word lines. In an SLC memory this may be a read voltage between the two memory states. In MLC the read voltage may between the lowest memory states. In some cases it may be desirable to perform a high resolution read so that a number of different read voltages may be used and threshold voltages of memory cells may be obtained within relatively narrow bands. This may provide information on the number of memory cells that are under-erased and also on the degree to which they are under-erased (how close their threshold voltages are to an acceptable threshold voltage for the erased condition). Such information may be useful in identifying a particular failure mode and/or selecting appropriate steps to take. For example, if a zone is close to being fully erased then performing another erase step may be a good approach. If the zone is far from being erased then further attempts to erase it may not justify the time and resources needed to carry out such attempts. A zone verify scheme may proceed word line by word line to determine the number of under-erased memory cells in a particular zone. If the number of such cells exceeds a threshold number then the zone is considered a bad zone.

In many memory systems, some blocks are marked as bad blocks and their locations are recorded in a bad block list so that they are not subsequently used for storage of user data. Thus, in such memory systems, blocks are divided between good blocks that are used for storage of user data and bad blocks that are not used for storage of user data. According to an example presented here, another category of block is a partial block that is partially usable for storage of user data. Such a partial block has at least one zone that is usable and at least one zone that is not usable because of an erase fail. Locations of partial blocks may be recorded in a manner that is similar to recording bad blocks. A separate partial block list may be maintained or recording of partial blocks may be combined with a bad block list.

FIG. 13 shows a table that has a status entry for bad blocks and partial blocks. Such a table may be maintained by a memory controller so that user data is stored appropriately. In particular, no user data is stored in bad blocks (e.g. Block 1 of FIG. 13) and an appropriate amount of user data is stored in partial blocks (e.g. Block 3 of FIG. 13). Because a partial block contains at least one bad zone it does not have the same data storage as a good block. The data storage capacity of a partial block diminishes with the number of bad zones (e.g. a partial block with two bad zones has less data storage capacity than a partial block with only one bad zone). In some cases, a block with more than one bad zone may be considered a bad block so that partial blocks have only one bad zone and therefore have the same data capacity. In other cases, blocks with two or more bad zones may be operated as partial blocks. In such memory systems, it is generally desirable to record the data storage capacity of partial blocks on a block-by-block basis so that user data can be allocated to blocks correctly.

FIG. 14 shows an example of a table that is maintained for a partial block such as Block 3 of FIG. 13. The table has entries for bad zones to indicate that these zones are not to be used for subsequent storage of user data and may require different operation during subsequent access to good zones. It is generally important to know locations of bad zones so that no user data is assigned to memory cells in such zones. In the example shown, zones 1 and 2 are bad while other zones are good. In some cases, a single zone may be bad due to a bad word line in the zone. In other cases, two or more word lines may short causing one or more zones to fail erase. While FIGS. 13 and 14 show two different tables, it will be understood that information regarding bad blocks and partial blocks and specific information about bad zones in partial blocks may be combined in a single table or record. Other formats may also be used for recording such information and the tables shown are merely examples to illustrate recording such information.

In addition to recording the locations of bad zones some additional steps may be taken to configure memory cells of bad zones so that memory cells outside the bad zones are not substantially affected by the bad zone. For example, some charge may be added to memory cells in a bad zone to reduce the chances of charge migration from memory cells of good zones to memory cells in a bad zone. Charge may be added to all memory cells of a bad zone using a simple operation, which, unlike programming user data, may not require any verification. Because the charge level (and threshold voltage) for a given memory cell in a bad zone does not correspond to any user data, such configuration may be relatively crude (e.g. using relatively high voltage pulses). A large group of memory cells in a bad zone may be configured together so that in aggregate they have some increased charge. This may be done without regard to individual threshold voltages of individual memory cells (i.e. without any verification). All memory cells in a bad zone may be configured in this way in some examples. In other examples, such configuration is limited to certain word lines in bad zones. For example, word lines in a bad zone that are near good zones may be configured while word lines far from good zones may not be configured. In this way, memory cells that are located where they might cause charge to leak from good memory cells have charge added to reduce such leakage. Memory cells that are far from any good cells (i.e. in interior of a bad zone) may not be subject to such configuration so that the time and power for configuration is reduced. In some cases, configuration may be performed just once when the zone is initially determined to be bad. In some cases, configuration may be necessary from time to time during use of the partial block. For example, when the block is erased the bad zone may lose charge from some word lines even if the entire zone is not fully erased. Thus, it may be desirable to replace such erased charge after an erase operation to return the bad block to a state that reduces charge leakage from neighboring zones.

Figure 15:
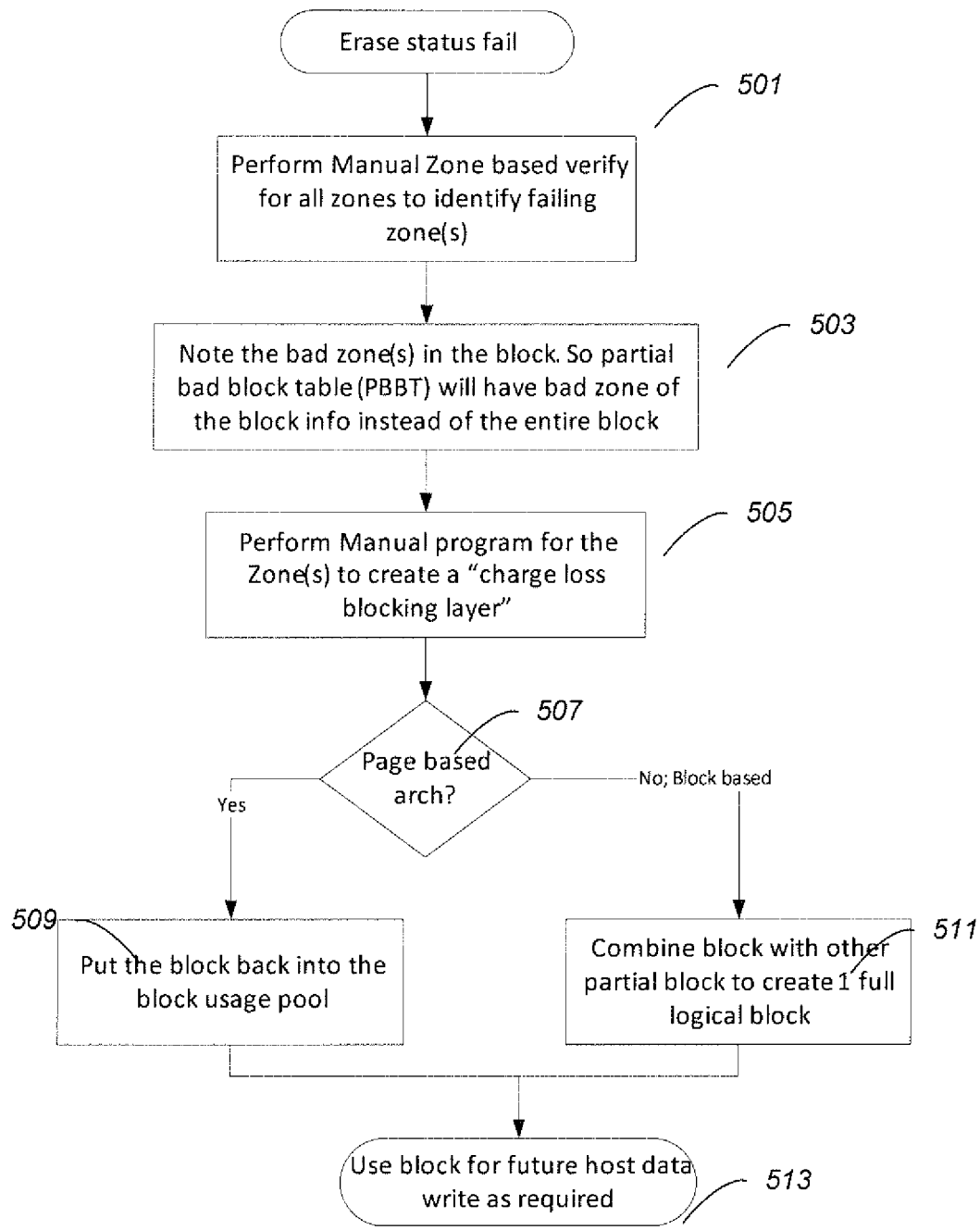
FIG. 15 illustrates a scheme for dealing with a block erase failure.

FIG. 15 illustrates a series of steps for dealing with a failure when erasing a block. A zone based verify is applied to all zones of the block that experienced the erase failure 501. The bad zone, or zones, are recorded in a partial bad block table 503 so that user data is not subsequently stored there. Subsequently, a charge loss blocking layer may be formed in the bad zone or zones 505 by adding charge to at least some of the memory cells of the bad zone. If the memory system uses a page-based architecture 507 then the block is placed in the block usage pool 509. If the memory system uses a block-based architecture then the memory controller may map data to the memory array in units equal to the capacity of a block. Because partial blocks have less capacity than a good block it may be necessary to combine partial blocks to form a unit ("logical block") that has the capacity of a good block 511. Subsequently, the block (or logical block) may be used for storage of user data 513.

Figure 16:
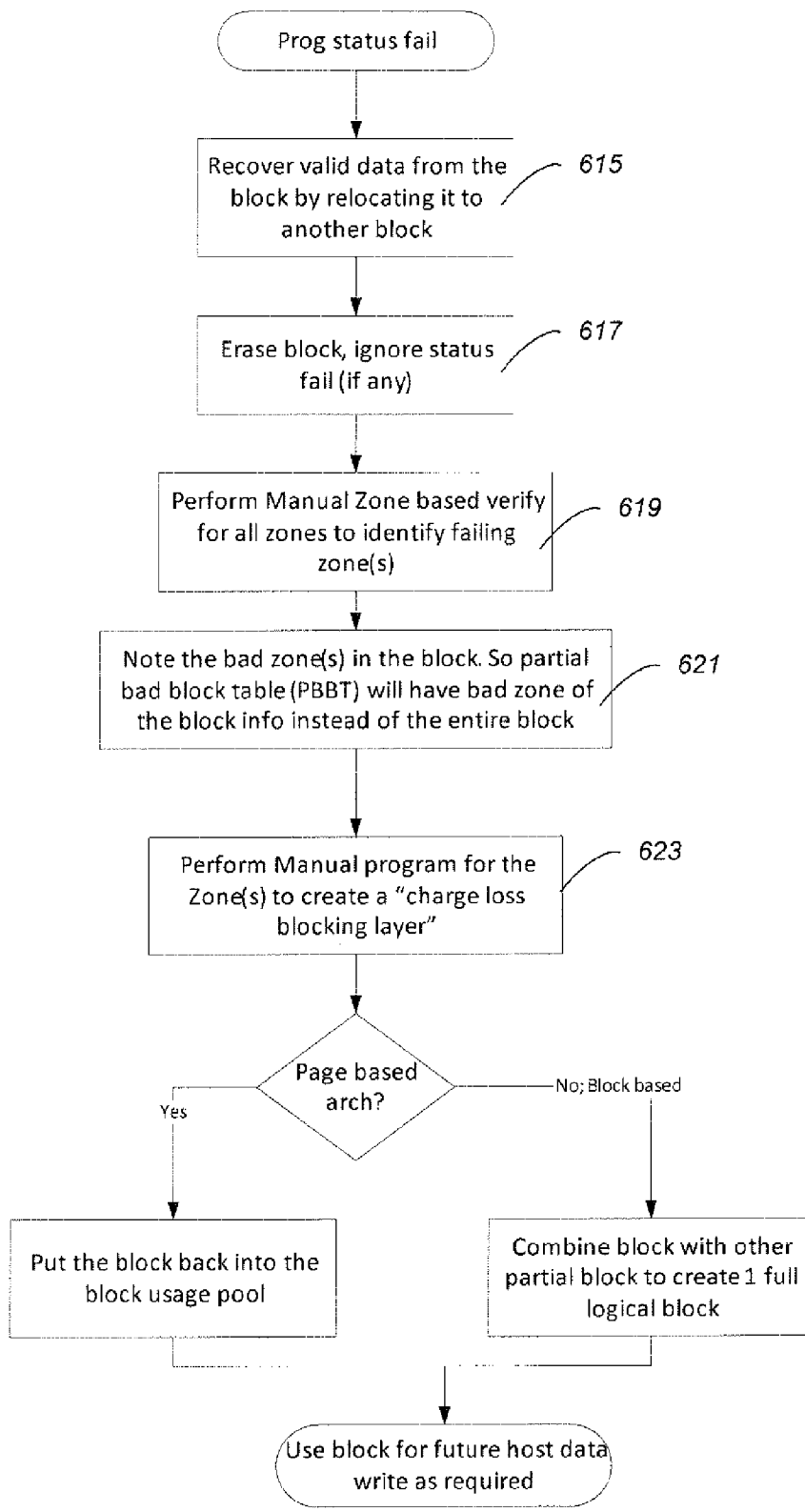
FIG. 16 illustrates a scheme for dealing with a programming failure.

FIG. 16 illustrates an example of a scheme for dealing with a programming failure. When a programming failure occurs, any valid data from the failed block is recovered and copied to a safe location in another block 615 thus making the copy in the failed block obsolete. The failed block is then erased, ignoring any status fails 617. When a block fails to program it generally fails to erase also so that there is an erase fail at this point. A zone based verification scheme is then applied to identify a bad zone or zones 619. Locations of bad zones are recorded so that user data is not subsequently stored in them 621. Subsequently, the bad zone or zones may be configured by creating a charge loss blocking layer as discussed above 623. And the block is then returned to use as discussed above.

Figure 17:
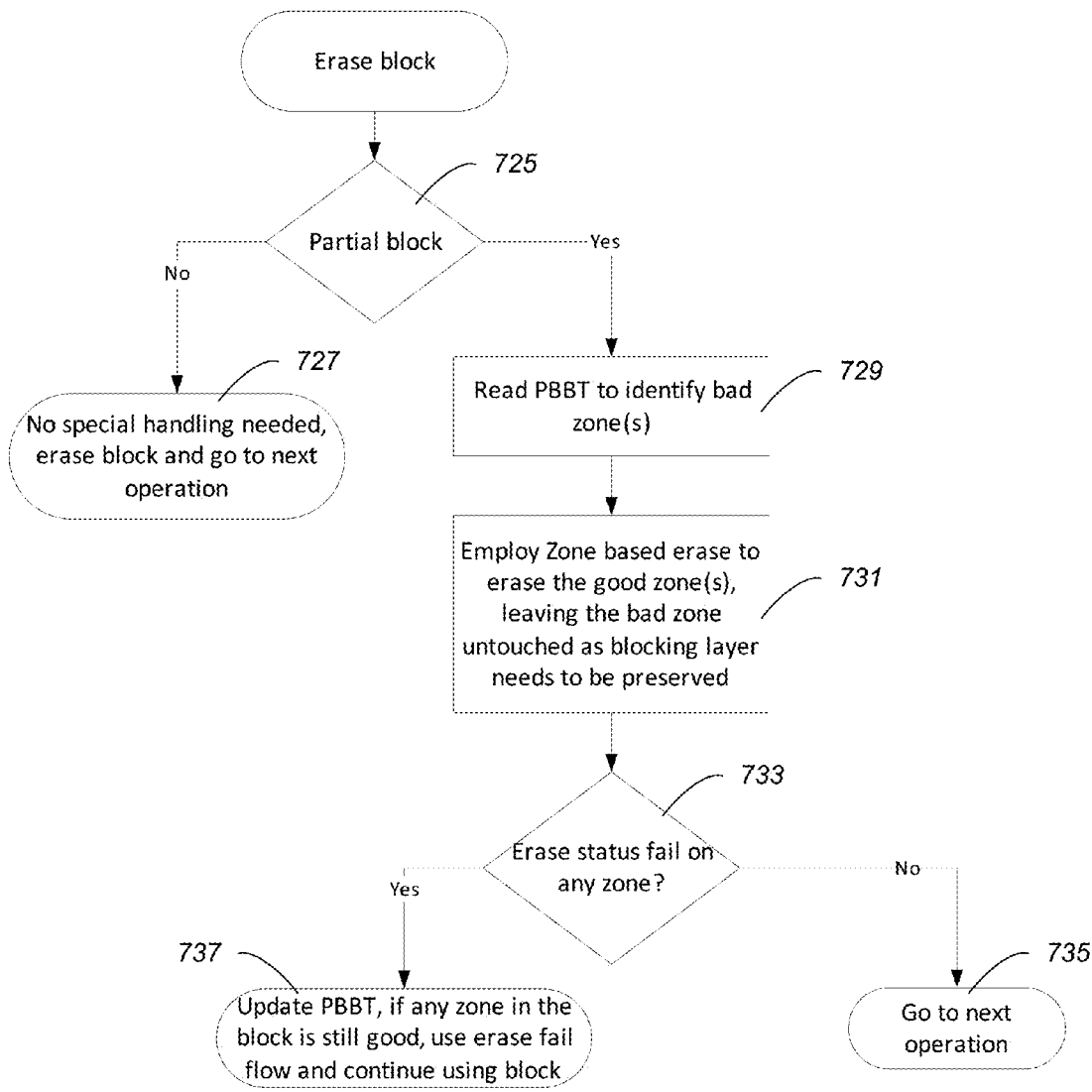
FIG. 17 illustrates an erasing scheme for a memory system that includes partial blocks.

FIG. 17 illustrates an example of an erase scheme for a memory that includes partial blocks. A determination is made as to whether a block to be erased (e.g. next block scheduled for erase) is a partial block 725. If the block is not a partial block then a conventional block erase operation may be performed so that all memory cells of the block are erased and verified together 727. If the block is a partial block then information regarding the partial block is retrieved, for example from a partial bad block table (PBBT) to identify the bad zone or zones 729. Subsequently, a zone based erase scheme erases only the good zones while leaving the bad zone or zones as before 731. For example, word line voltages may be applied to create sufficient voltage to erase memory cells in good zones but not in bad zones. Subsequently, erase of the good zones is verified on a zone-by-zone basis 733. If none of the good zones failed erase, then the partial block may be considered erased and ready for programming 735. If one or more of the previously good zones fail the zone-by-zone verification then they are added to the partial bad block table 737. In this example, the block is returned to use as long as there is at least one good zone. In other examples, blocks may be designated as bad blocks when more than a certain number of zones are bad. For example, if more than half the zones are bad then the entire block may be designated as a bad block and no more data may be stored in the block.

Figure 18:
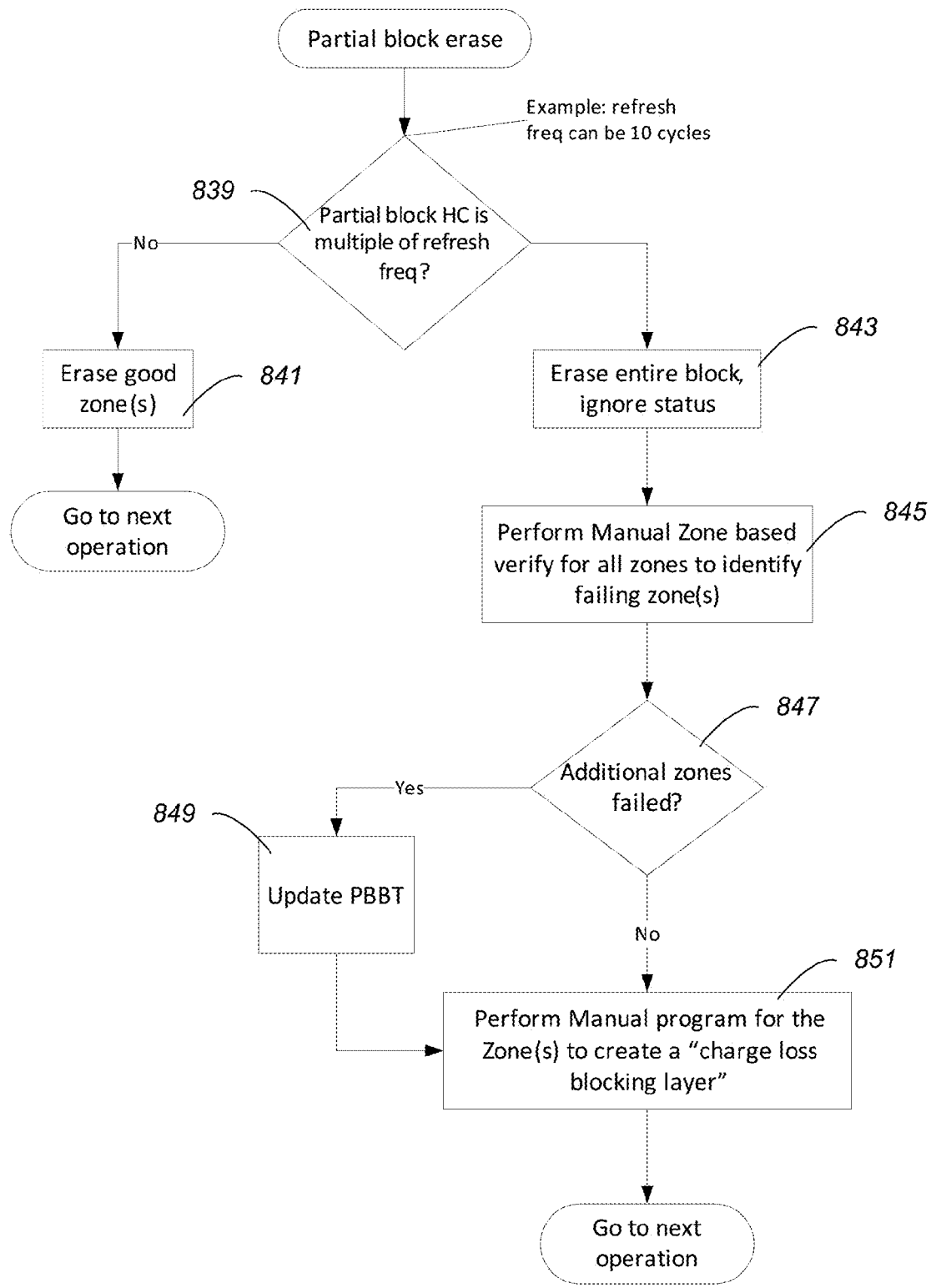
FIG. 18 illustrates a scheme for maintaining partial blocks.

FIG. 18 illustrates an example of a partial block erase scheme. A determination is made as to whether the number of write/erase cycles (hot count, or "HC") experienced by a partial block is some multiple of an interval set for refresh 839. For example, if a refresh is to be performed every 100 cycles then this condition is met at 100 cycles, 200 cycles, 300 cycles and so on. If the hot count does not meet this condition then the erase continues 841 as in FIG. 17. If the condition is met then the entire block is erased as a unit (not zone by zone) and any erase failures are ignored 843. Subsequently, verification is performed on a zone-by-zone basis to identify any failed zones 845. If there are additional failed zones 847 then they are added to the partial bad block table 849. Subsequently, all bad zones (including previously identified and newly identified bad zones) are configured to create charge loss blocking layers by adding charge to at least some memory cells 851. The partial block is then available for storing user data.

Figure 19:
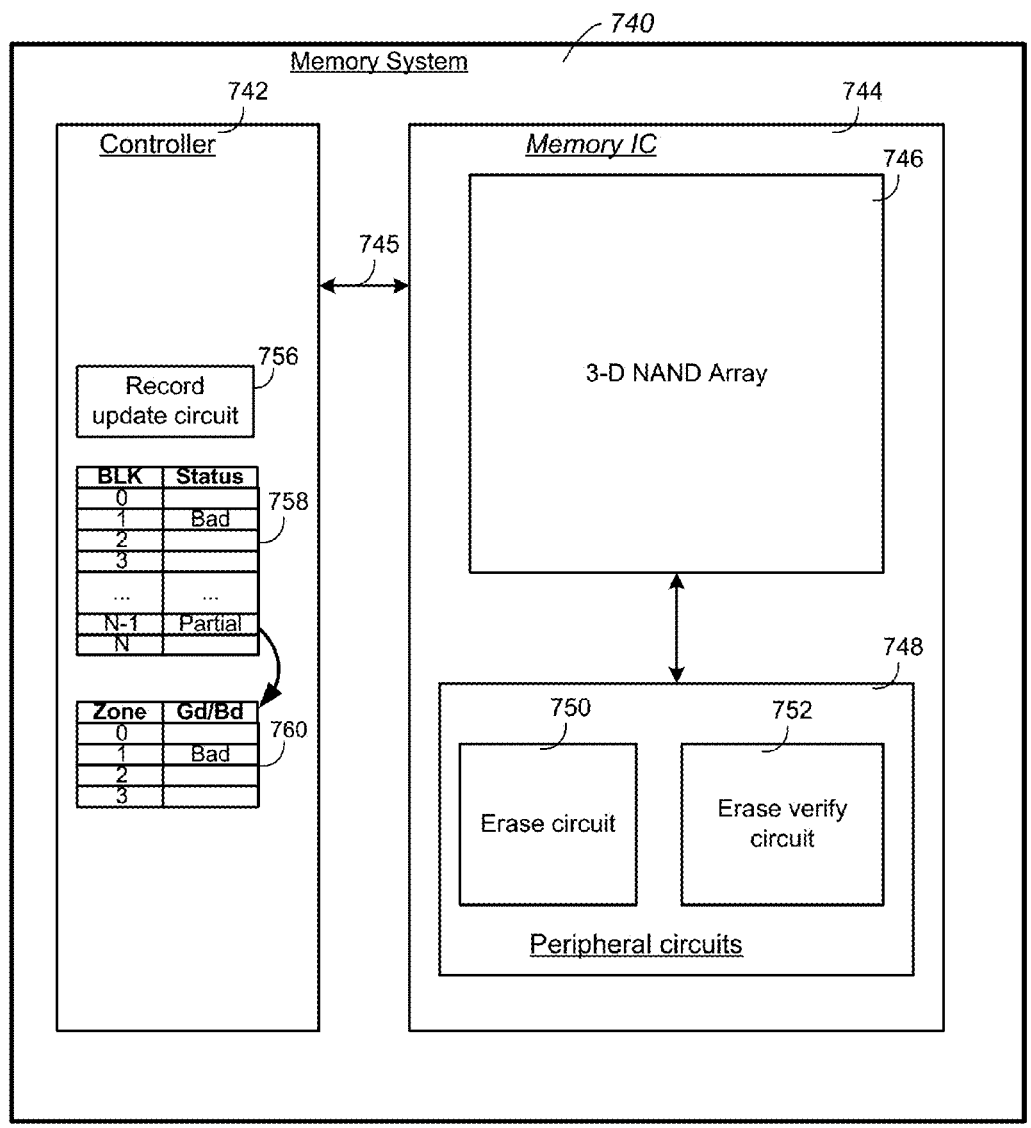
FIG. 19 illustrates an example of memory system hardware.

FIG. 19 shows an example of hardware that may be used to implement aspects of the present invention. In particular, FIG. 19 shows memory system 740 that includes a memory controller 742, a memory integrated circuit 744, and a bus 745 connecting the controller to the memory IC. It will be understood that multiple memory integrated circuits may be connected to a memory controller in a multi-die arrangement that may use one or more bus for communication. Memory IC 744 includes a 3-D NAND flash memory array 746 and peripheral circuits 748 that are formed on a common die or substrate. Memory array 746 includes bad blocks that are not used for storage of user data and partial blocks that fail to erase but which contain good zones or sub-blocks that are used to store user data. Peripheral circuits 748 include driver circuits to apply appropriate voltages to elements of memory array 746 in order to access data in memory array 746. Peripheral circuits 748 include erase circuits 750 and erase verify circuits 752. Erase circuits 750 apply an erase voltage to word lines of a block in order to erase the block. Erase verify circuits 752 have at least two different verify modes. In a block erase verify mode, erase verify circuits 752 determine if memory cells of a block are sufficiently erased and return an indication that the block is either erased or not. In a sub-block erase verify mode, erase verify circuits 752 determine if memory cells of a particular zone or sub-block within a block are sufficiently erased and may proceed sequentially zone-by-zone through the block. Other circuits such as read and write circuits (not shown) are also provided in peripheral circuits 748. Memory controller 742 includes a record update circuit 756 that records which blocks are bad, which blocks are partially bad (partial blocks), and which sub-blocks within partial blocks are bad. Record update block 756 may update these records over time as more bad blocks and bad sub-blocks develop. Table 758 is maintained by record update circuit 756 to indicate which blocks are bad and which blocks are partially bad. Table 760 (which may be incorporated in table 758) indicates bad zones or sub-blocks of a partially bad block (e.g. bad zone 1 of block N−1 in FIG. 19).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating blocks of memory cells in a block-erasable NAND flash memory comprising:
    performing a block erase operation that applies an erase voltage to all word lines of the block;
    subsequently performing a block erase verify operation to determine if the block erase operation was successful;
    in response to determining that the block erase operation was not successful performing a sub-block erase verify operation that applies an erase verify voltage to a first subset of word lines of the block and does not apply the erase verify voltage to a second subset of word lines of the block to determine if the block erase operation successfully erased the first subset of word lines; and
    if the sub-block erase verify operation indicates that the first subset of word lines is erased then designating the first subset of word lines as a good subset for subsequent storage of data.

2. The method of claim 1 wherein the sub-block erase verify operation applies additional erase verify voltages to the first subset of word lines of the block to obtain a distribution of threshold voltages of the sub-block.

3. The method of claim 1 wherein the first subset of word lines of the block consists of one word line and the erase verify voltage is a read voltage, and all other word lines of the block receive a read pass voltage.

4. The method of claim 1 further comprising: performing one or more additional sub-block erase verify operations to identify other subsets of word lines of the block for designation as good subsets for subsequent storage of data.

5. The method of claim 4 further comprising: if the sub-block erase verify operation or an additional sub-block erase verify operation indicates that a corresponding subset of word lines is not erased then designating the corresponding subset of word lines as a bad subset that is not good for subsequent storage of data.

6. The method of claim 4 wherein the one or more additional sub-block erase verify operations are performed for subsets that include all word lines of the block so that the entire block is mapped into subsets and each subset is either designated as being a good subset for subsequent storage of data or as a bad subset that is not for subsequent storage of data.

7. The method of claim 6 wherein each subset is an individual word line that is subject to a separate sub-block erase verify and is individually designated as a good word line for subsequent storage of data or as a bad word line that is not for subsequent storage of data.

8. The method of claim 6 wherein each subset is a plurality of word lines that is subject to a separate sub-block erase verify and is individually designated as a good plurality of word lines for subsequent storage of data or as a bad plurality of word lines for subsequent storage of data.

9. The method of claim 8 wherein word lines of the block are divided into subsets in zones based on physical location, zones consisting of equal numbers of neighboring word lines.

10. The method of claim 9 wherein the block-erasable NAND flash memory is a monolithic three-dimensional semiconductor memory device comprising a plurality of memory device levels vertically disposed above a silicon substrate and word lines of the block are divided into zones based on respective vertical levels with respect to the underlying substrate.

11. The method of claim 10 wherein driver circuits for accessing the block-erasable NAND flash memory are also disposed on the silicon substrate.

12. A method of operating a block of memory cells in a monolithic three-dimensional block-erasable memory device that has a plurality of device levels vertically disposed above a silicon substrate comprising:
    performing a block erase operation that applies an erase voltage to word lines in all of the plurality of memory device levels of the block;
    subsequently performing a block erase verify operation to determine if the block erase operation was successful;
    in response to determining that the block erase operation was not successful performing a series of sub-block erase testing operations that apply an erase verify voltage to word lines of a selected sub-block of the block while not applying the erase verify voltage to word lines of unselected sub-blocks of the block to verify if word lines of the selected sub-block are erased;
    subsequently mapping each of the sub-blocks as either a good sub-block or a bad sub-block according to the results of the sub-block testing operations; and
    subsequently storing user data in good sub-blocks while prohibiting storage of user data in bad sub-blocks.

13. The method of claim 12 wherein the block includes a plurality of sets of strings, each set of strings comprising vertical NAND strings that share word lines, and further comprising individually performing erase testing on a first set of strings by applying an erase voltage to word lines of the first set of strings while not applying the erase verify voltage to word lines of unselected sets of strings.

14. The method of claim 13 further comprising individually performing erase testing on each set of strings of the block and designating any set of strings that fails erase testing as a bad set of strings that is not good for subsequent storage of data.

15. The method of claim 12 further comprising configuring the bad sub-blocks by raising threshold voltages of memory cells of the bad-sub blocks above an erased level.

16. The method of claim 15 further comprising subsequently repeating the configuring of the bad sub-blocks at intervals based on write-erase cycle count of the block.

17. The method of claim 12 further comprising applying different voltages to word lines of good sub-blocks and bad sub-blocks during subsequent memory access operations.

18. The method of claim 17 wherein applying different voltages includes applying an erase voltage to word lines of good sub-blocks during subsequent erase operations while applying a voltage that is lower than the erase voltage to word lines of bad sub-blocks.

19. The method of claim 17 wherein applying different voltages includes at least one of: applying a different read pass voltage, or applying a different write pass voltage, or applying a different boosting voltage.

20. A monolithic block-erasable three-dimensional semiconductor memory device formed in multiple physical levels of memory elements disposed above a silicon substrate comprising:

a first plurality of blocks that pass block erase testing and are designated for block erase in which an erase voltage is applied to word lines of all physical levels of the block at the same time; and a second plurality of blocks that fail block erase testing and subsequently pass sub-block erase testing and are configured for sub-block operation in which at least one sub-block that includes a plurality of word lines is designated as a bad sub-block and is not used to store user data while at least one other sub-block that includes a plurality of word lines is designated as a good sub-block and is used to store user data.

21. The monolithic block-erasable three-dimensional semiconductor memory device of claim 20 wherein word lines of a block of the second plurality of blocks are divided into sub-blocks according to their physical level with respect to the silicon substrate.

22. The monolithic block-erasable three-dimensional semiconductor memory device of claim 20 further comprising driver circuitry associated with one or more of said memory elements, the driver circuitry disposed on the silicon substrate.

* * * * *